United States Patent [19]

Bird

[11] Patent Number: 5,729,963
[45] Date of Patent: Mar. 24, 1998

[54] COMPONENT CARRIER TAPE

[75] Inventor: Gerald C. Bird, Woodbury, Minn.

[73] Assignee: Minnesota Mining and Manufacturing Company, St. Paul, Minn.

[21] Appl. No.: 804,531

[22] Filed: Feb. 21, 1997

Related U.S. Application Data

[62] Division of Ser. No. 500,720, Jul. 11, 1995, Pat. No. 5,648,136.

[51] Int. Cl.$^6$ .................. B65B 7/28; B65B 9/04
[52] U.S. Cl. .................. 53/471; 53/453; 53/485
[58] Field of Search .................. 53/453, 454, 471, 53/473, 475, 428, 485, 281, 559, 560, 282, 287; 206/714, 713

[56] References Cited

U.S. PATENT DOCUMENTS

| | | | |
|---|---|---|---|
| 3,281,383 | 10/1966 | Zelinski et al. | 260/23.7 |
| 3,837,994 | 9/1974 | Flanagan et al. | 161/100 |
| 4,406,367 | 9/1983 | Bouwknegt | 206/329 |
| 4,575,995 | 3/1986 | Tabuchi et al. | 53/453 X |
| 4,662,874 | 5/1987 | Korpman | 604/370 |
| 4,667,944 | 5/1987 | Althouse | 269/21 |
| 4,702,788 | 10/1987 | Okui | 156/252 |
| 4,711,014 | 12/1987 | Althouse | 29/412 |
| 4,753,061 | 6/1988 | Braden et al. | 53/471 |
| 4,778,326 | 10/1988 | Althouse et al. | 414/786 |
| 4,853,286 | 8/1989 | Narimatsu et al. | 428/343 |
| 4,966,281 | 10/1990 | Kawanishi et al. | 206/330 |
| 5,085,655 | 2/1992 | Mann et al. | 604/389 |
| 5,089,314 | 2/1992 | Masujima et al. | 428/156 |
| 5,126,178 | 6/1992 | Takemura et al. | 428/40 |
| 5,136,827 | 8/1992 | Sawaya | 53/453 |
| 5,183,699 | 2/1993 | Takemura et al. | 428/214 |
| 5,191,693 | 3/1993 | Umetsu | 53/453 X |
| 5,203,143 | 4/1993 | Gutentag | 53/452 |
| 5,274,036 | 12/1993 | Korpman et al. | 525/92 |
| 5,325,654 | 7/1994 | Juntunen et al. | 53/471 X |

FOREIGN PATENT DOCUMENTS

| | | |
|---|---|---|
| 0 157 508 A2 | 10/1985 | European Pat. Off. . |
| 0 252 739 B1 | 1/1988 | European Pat. Off. . |
| 0 520 515 A2 | 12/1992 | European Pat. Off. . |
| 0 530 729 A1 | 3/1993 | European Pat. Off. . |
| 0 588 180 A1 | 3/1994 | European Pat. Off. . |
| 62-58638 | 3/1987 | Japan . |
| 62-66825 | 3/1987 | Japan . |
| 62-121781 | 6/1987 | Japan . |
| 2-269672 | 11/1990 | Japan . |
| 5-230426 | 9/1993 | Japan . |
| 6-136186 | 5/1994 | Japan . |
| 7-019232 | 1/1995 | Japan . |
| WO 95/10576 | 4/1995 | WIPO . |

*Primary Examiner*—James F. Coan
*Attorney, Agent, or Firm*—Gary L. Griswold; Walter N. Kirn; Steven E. Skolnick

[57] ABSTRACT

A flexible carrier tape for storage and delivery of components by an advancement mechanism, comprises a strip portion, a plurality of aligned pockets spaced along the strip portion for carrying the components, wherein each pocket includes a bottom wall, and a non-pressure sensitive adhesive comprising a thermoplastic elastomer block copolymer on the bottom wall of the pocket for retaining a component in the pocket.

22 Claims, 4 Drawing Sheets

COMPONENT CARRIER TAPE

This is a division of application Ser. No. 08/500,720 filed Jul. 11, 1995 now U.S. Pat. No. 5,648,136.

BACKGROUND OF THE INVENTION

1. Technical Field

This invention relates generally to carrier tapes of the kind used to transport components from a component manufacturer to a different manufacturer that assembles the components into new products. More specifically, this invention relates to carrier tapes for storing electronic surface mount components and for supplying those components seriatim to a machine.

2. Description of the Related Art

In general, carrier tapes that are used to transport components from a component manufacturer to a different manufacturer that assembles the components into new products are well known. For example, in the field of electronic circuit assembly, electronic components are often carried from a supply of such components to a specific location on a circuit board for attachment thereto. The components may be of several different types, including surface mount components. Particular examples include memory chips, integrated circuit chips, resistors, connectors, dual in-line processors, capacitors, gate arrays, etc. Such components are typically affixed to a circuit board that may later be incorporated into an electronic device.

Rather than manually affixing each individual electronic component to a circuit board, the electronics industry makes extensive use of robotic placement machines, sometimes known as "pick-and-place" machines, which grasp a component at a specific location (the supply) and place it at another specific location (the circuit board). To ensure the sustained operation of the robotic placement machine, a continuous supply of electronic components must be furnished to the machine at a predetermined rate and location to permit the machine to be programmed to repeat a precise sequence of movements during every cycle. It is therefore important that each such component be located in the same position (i.e. the point at which the robotic placement machine grasps the component) as each preceding and succeeding component.

One way to provide a continuous supply of electronic components to a desired location is to use a carrier tape. Conventional carrier tapes generally comprise an elongated strip that has a series of identical pockets formed at predetermined, uniformly spaced intervals along the length of the tape. The pockets are designed to receive an electronic component. A continuous cover tape is applied over the elongated strip to retain the components in the pockets. The tapes also normally include a series of through holes uniformly spaced along one or both edges of the elongated strip. The through holes receive the teeth of a drive sprocket that advances the tape toward the robotic placement machine.

Each pocket is shaped to closely receive the electronic component. Frequently, the pockets are sized to match a particular component. In fact, the tolerances between the component and the pocket walls may be quite small such that a given carrier tape may only be useful with a single size of component. Thus, a component of a different size would require a new pocket design. In conventional carrier tapes, if the pockets are not properly sized for the stored component, the component may rotate within the pocket making subsequent removal by automatic pick-up equipment difficult or impossible since these devices require precise component orientation for proper removal. A component may even turn over within its pocket during shipping, necessitating reorientation of the stored component. Excessive component movement may also result in a component becoming damaged as it collides with the pocket walls. Given these variables, it can be expensive to design, manufacture and store a multitude of different carrier tapes having different pocket designs for different components.

Eventually, the carrier tape is fed to a robotic placement machine that strips the continuous cover tape from the carrier and removes the components from the pockets and places them onto the circuit board. Removal of the component is commonly accomplished with a vacuum pick-up device that grasps the top of the component by suction. The vacuum pick-up may be assisted by a push-up needle or probe that penetrates a hole formed in the floor of the pocket to push up against the component. The removed cover tape is waste that must be gathered and disposed.

U.S. Pat. No. 4,778,326 (Althouse et al.) discloses a carrier that is adapted for handling semiconductor chips and other smooth-surfaced articles. The carrier includes a base that has a recess within its interior. The recess includes a plurality of protuberances that support a thin flexible film cover that overlies the base. Semiconductor chips are carried on the upper surface of the cover. By connecting the base to a vacuum, the cover can be drawn down into the base recess and against the protrusions. This converts the cover from a flat condition in full surface contact with the semiconductor chip to a wavy or undulating condition having reduced surface contact with the semiconductor chip. Reportedly, the reduced surface area contact facilitates removal of the semiconductor chip.

However, Althouse et al. note that while their invention is adapted for use with a wide variety of chip sizes, the number and the size of the protuberances employed in the base are selected in relationship to the size of the chips to be handled. As a result, a chip which is too small for proper use with the carrier could be drawn down with the cover into a recess and its removal from the carrier would not be facilitated.

U.S. Pat. No. 4,667,944 (Althouse) discloses a related device in which a textured fabric is sandwiched between the cover and the base. To facilitate removing the semiconductor chip from the cover, surface contact between the cover and the chip is reduced by drawing portions of the cover into crevices in the upper face of the textured fabric by applying a vacuum thereto.

Although the invention is apparently adapted for use with a wide variety of chip sizes, Althouse notes that among the factors to be considered in selecting the textured fabric is the size of the devices to be handled.

U.S. Pat. No. 5,089,314 (Masujima et at.) discloses a carrier tape for surface mounted electronic circuit elements which includes a tape body having an adhesive applied thereto. The adhesive is formed of a material that does not exhibit any adhesion at a normal temperature but which does exhibit adhesion when heated to a temperature of about 80° C. The adhesive may be a silicone, an acrylic resin, or a mixture of silicone and acrylic resin. When the electronic circuit element is removed from the carrier, the adhesive transfers to the bottom of the circuit element. The circuit element and the adhesive are then heated such that the adhesive can provisionally bond the circuit element to a printed circuit board.

U.S. Pat. No. 4,966,281 to Kawanishi et al. discloses an electronic component carrier having a series of electronic component-mounting portions that include a layer of adhesive. The adhesive is a rubber type, an acryl type or a silicone type having suitable pressure sensitive adhesive properties. The use of a push bar enables smooth removal of the electronic component from the adhesive layer.

However, there is still a need for a carrier tape that can securely retain a stored component in the proper orientation for subsequent removal by an automated device. It would be highly desirable if this could be accomplished without the need for separate carrier tapes for different component sizes and designs. It would also be highly desirable if this could be accomplished without using a cover tape. Such carrier tapes would offer even further advantages if any adhesive used to retain the components on the carrier tape did not display pressure sensitve adhesive properties because tacky pressure sensitve adhesives can retain dirt and other potential contaminants. Similarly, it would be useful if the adhesive did not transfer to the stored component upon removal of the component so as to reduce the risk of contamination.

SUMMARY OF THE INVENTION

In one embodiment, the invention relates to a flexible carrier tape for storage and delivery of components by an advancement mechanism. The carrier tape comprises a strip portion having a top surface, a bottom surface opposite the top surface, a plurality of aligned pockets for carrying the components, the pockets being spaced along the strip portion and opening through the top surface thereof. The pockets include at least one side wall that adjoins and extends downwardly from the strip portion, and a bottom wall that adjoins the side wall. The pockets more preferably include four side walls each at generally right angles with respect to each adjacent side wall. Typically, each of the pockets is essentially identical and are equally spaced along the strip portion. The bottom wall of each pocket may include an aperture or through hole to, for example, accommodate a mechanical push-up. The strip portion further has first and second parallel longitudinal edge surfaces, and preferably at least one of the edge surfaces includes a plurality of equally spaced holes for receiving the advancement mechanism.

The bottom wall of the pocket includes a non-pressure sensitive adhesive for retaining the component in the pocket. The adhesive inherently displays sufficient adhesion to the component at room temperature to retain the component in the pocket. The adhesive comprises a thermoplastic elastomer block copolymer and preferably has a storage modulus greater than $1 \times 10^6$ Pascals at room temperature. The thermoplastic elastomer block copolymer may comprise segments of styrene and segments of a rubbery elastomer. Specific examples of thermoplastic elastomer block copolymers useful in the invention include styrene-ethylene/propylene-styrene block copolymer, styrene-ethylene/propylene-styrene-ethylene/propylene block copolymer, styrene-ethylene/butylene-styrene block copolymer, and blends thereof.

Advantageously, the adhesive may exhibit a peel adhesion of about 20 to 200 grams per linear inch width to the stored component (more preferably, a peel adhesion of about 50 to 140 grams per linear inch width) and can maintain this adhesion even after dwelling in contact with the component for a period of at least 7 days under ambient conditions. However, upon removal of the component from the pocket, the adhesive desirably does not transfer to the component.

Optionally, the adhesive may include an adhesion modifier to achieve the desired level of adhesion. The adhesion modifier may be a tackifying resin (which typically is present in an amount of less than 10% by weight, based on the combined weight of the thermoplastic elastomer block copolymer and tackifying resin), a liquid rubber (which typically is present in an amount of less than 20% by weight based on the combined weight of the thermoplastic elastomer block copolymer and the liquid rubber), or a photocrosslinking agent.

The carrier tape can optionally include a cover that is releasably secured to the top surface of the strip portion, extends along the strip portion, and covers the pockets. Advantageously, however, the carrier tapes of the invention do not require a cover.

The carrier tapes of the invention are especially useful for storing and delivering surface mount electronic components to a machine, such as a robotic placement machine. To facilitate this, the carrier tape can be wound about a core to form a supply reel.

Since the adhesive provides the means for securely retaining the component in the pocket, a single pocket having a generic design may be used to accomodate components of widely varying shape and size. Consequently, the pockets need not be shaped to closely receive the component nor must the pockets be sized to match a particular component.

BRIEF DESCRIPTION OF THE DRAWINGS

The invention will be more fully appreciated with reference to the following drawings in which similar reference numerals designate like or analogous components throughout and in which.

DETAILED DESCRIPTION OF THE PREFERRED EMBODIMENTS

Figure 1:
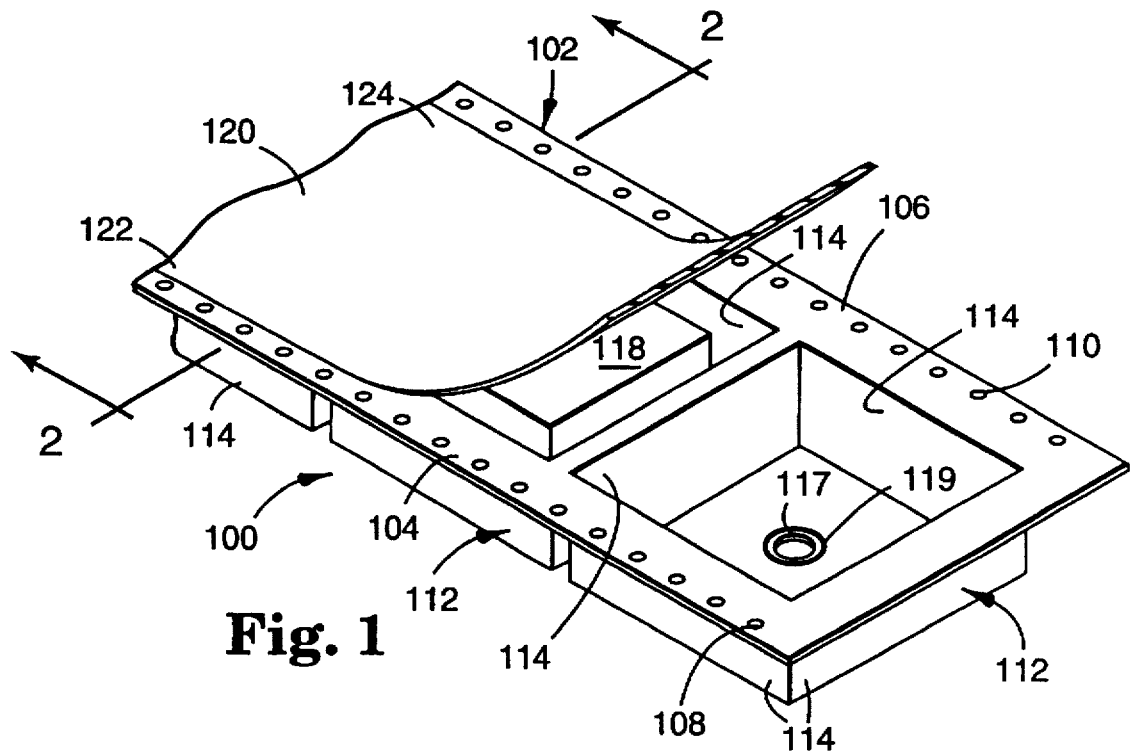
FIG. 1 is a fragmentary perspective view of one embodiment of a carrier tape according to the invention with an optional cover thereof having been partially removed to show components stored within the carrier tape, although the component has been omitted from the leading pocket in order to show the interior of the pocket more clearly.
Figure 2:
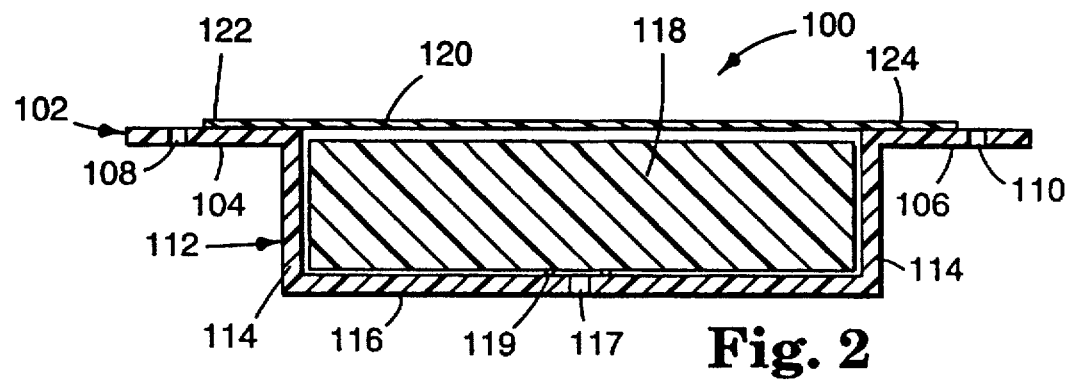
FIG. 2 is a sectional view taken along lines 2—2 in FIG. 1.

Turning now to the drawings, one embodiment of a carrier tape according to the invention is shown in FIGS. 1 and 2. The illustrated carrier tape is useful for the storage and delivery of components (especially electronic components) by an advancement mechanism. More specifically, a unitary flexible carrier tape 100 has a strip portion 102 defining a top surface and a bottom surface opposite the top surface. Strip portion 102 includes longitudinal edge surfaces 104 and 106, and a row of aligned advancement holes 108 and 110 formed in and extending along one, and preferably both, edge surfaces. Advancement holes 108 and 110 provide a means for receiving an advancement mechanism such as the teeth of a sprocket drive for advancing carrier tape 100 toward a predetermined location.

A series of pockets 112 is formed in and spaced along strip portion 102, the pockets opening through the top surface of the strip portion. Within a given carrier tape, each pocket is usually essentially identical to the other pockets. Typically, they are aligned with each other and equally spaced apart. In the illustrated embodiment, each pocket includes four side walls 114, each at generally right angles with respect to each adjacent wall. Side walls 114 adjoin and extend downwardly from the top surface of the strip portion and adjoin bottom wall 116 to form pocket 112. Bottom wall 116 is generally planar and parallel to the plane of strip portion 102. Optionally, though desirably, bottom wall 116 may include an aperture or through hole 117 that is of a size to accommodate a mechanical push-up (e.g., a poke-up needle) to facilitate removal of component 118 (such as an electronic component) that is stored in pocket 112. Aperture 117 may also be used by an optical scanner to detect the presence or absence of a component within any given pocket. In addition, aperture 117 may be useful in applying a vacuum to the pocket to permit more efficient loading of the pockets with components. A ring of adhesive 119 circumscribes aperture 117 in the leading pocket and is discussed more fully hereinbelow.

Pockets 112 may be designed to conform to the size and shape of the components that they are intended to receive although as discussed more fully below, one of the advantages afforded by the present invention is that a single pocket of generic design may readily accommodate components of widely varying size and shape. Although not specifically illustrated, the pockets may have more or less side walls than the four that are shown in the preferred embodiment. In general, each pocket includes at least one side wall that adjoins and extends downwardly from strip portion 102, and a bottom wall that adjoins the side wall to form the pocket. Thus, the pockets may be circular, oval, triangular, pentagonal, or have other shapes in outline. Each side wall may also be formed with a slight draft (i.e., a 2° to 12° slant toward the center of the pocket) in order to facilitate insertion of the component, and to assist in releasing the pocket from a mold or forming die during fabrication of the carrier tape. The depth of the pocket can also vary depending on the component that the pocket is intended to receive. In addition, the interior of the pocket may be formed with ledges, ribs, pedestals, bars, rails, appurtenances, and other similar structural features to better accommodate or support particular components. Although a single column of pockets is illustrated in the drawings, two or more columns of aligned pockets could also be formed along the length of the strip portion in order to facilitate the simultaneous delivery of multiple components. It is expected that the columns of pockets would be arranged parallel to each other with pockets in one column being in aligned rows with the pockets in the adjacent column(s).

Strip portion 102 may be formed of any polymeric material that has a sufficient gauge and flexibility to permit it to be wound about the hub of a storage reel. A variety of polymeric materials may be used including, but not limited to, polyester (e.g., glycol-modified polyethylene terephthalate), polycarbonate, polypropylene, polystyrene, polyvinyl chloride, and acrylonitrile-butadiene-styrene. Strip portion 102 may be optically clear, pigmented or modified to be electrically dissipative. In the latter case, the strip may include an electrically conductive material, such as carbon black or vanadium pentoxide, that is either interspersed within the polymeric material or is subsequently coated onto the strip. The electrically conductive material allows an electric charge to dissipate throughout the carrier tape and preferably to the ground. This feature may prevent damage to components contained within the carrier tape due to an accumulated static electric charge.

Carrier tape 100 may optionally include an elongate cover 120, although as explained more fully below, one of the advantages afforded by the present invention is that a cover tape is not required. Cover 120 is applied over the pockets of the carrier tape to provide an additional way of retaining the components therein. Cover 120 can also protect the components from dirt and other contaminants that could invade the pockets. As best shown in FIGS. 1 and 2, cover 120 is flexible, overlies part or all of pockets 112, and is disposed between the rows of advancement holes 108 and 110 along the length of strip portion 102. Cover 120 is releasably secured to the top surface of strip portion 102 so that it can be subsequently removed to access the stored components. As illustrated, cover 120 includes parallel longitudinal bonding portions 122 and 124 that are bonded to longitudinal edge surfaces 104 and 106, respectively, of strip portion 102. For example, a pressure sensitive adhesive such as an acrylate material, or a heat-activated adhesive such as an ethylene vinyl acetate copolymer, may be used to adhere the cover to edge surfaces 104 and 106. Alternatively, cover 120 could be secured to strip portion 102 by a mechanical fastener such as a snap fit interference fastener or a hook and loop fastener (with the hooks being carried by either the cover or the strip portion and the loops being carried by the other).

As noted above, bottom wall 116 of pocket 112 includes a ring of adhesive 119 that circumscribes aperture 117. Adhesive 119 provides a means for securely retaining component 118 in the pocket. As a result, a single pocket having a generic design may be used to accomodate components of widely varying shape and size since adhesive 119 provides the principle means for retaining the component in the pocket. Consequently, pockets 112 need not be shaped to closely receive the component nor must the pockets be sized to match a particular component. The tolerances between the component and the pocket walls may be quite liberal. Moreover, cover 120 is not required to retain a component in the pocket and its elimination facilitates handling the stored components since waste otherwise generated by removing the cover does not have to be gathered and disposed.

Figure 3:
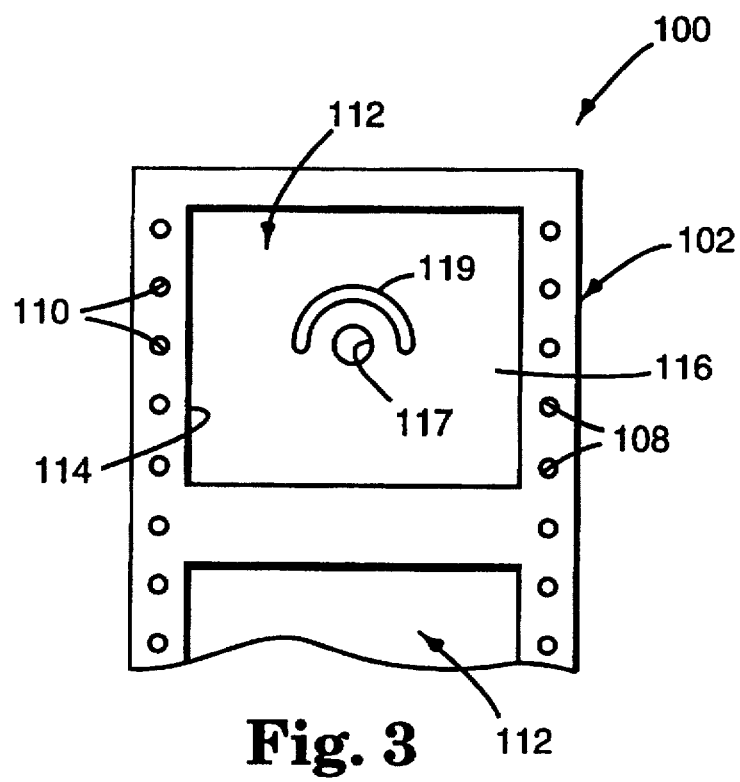
FIG. 3 is a plan view showing another embodiment of a carrier tape according to the invention.
Figure 4:
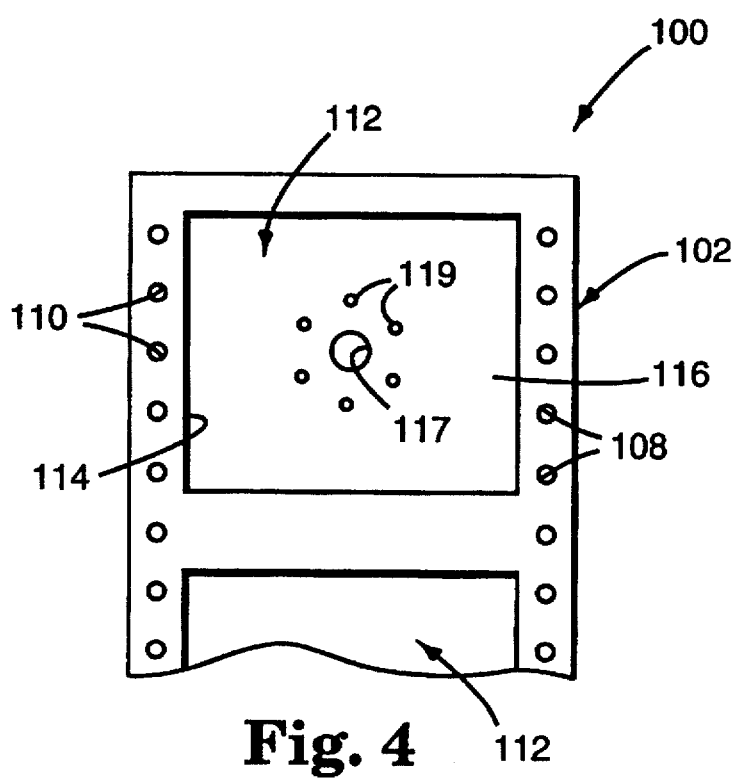
FIG. 4 is a plan view similar to FIG. 3 and showing a further embodiment of the invention.

While FIG. 1 shows adhesive 119 as a ring circumscribing aperture 117, neither the shape nor the placement of the adhesive is critical. Thus, as shown in FIG. 3, adhesive 119 may assume a half-ring or crescent shape, while the embodiment illustrated in FIG. 4 comprises a series of round, spaced apart dots of adhesive distributed in a circular array about aperture 117. The dots of adhesive may have other shapes (such as squares, triangles, etc.) and may be arranged in other than a circular array (such as a square or triangular distribution). The illustrated embodiments show the adhesive centered with respect to aperture 117. While this is preferred, the adhesive may be positioned anywhere on the bottom wall of the pocket so long as the stored component can be removed therefrom.

The amount of adhesive employed may vary over a wide range and will be influenced to a signifcant degree by the size of the component to be carried by the tape, larger components requiring a larger amount of adhesive. In general the amount of adhesive that is used is sufficient to securely retain the component in the pocket in a readily retrievable orientation (flat is preferred) but without creating an adhesion level that is so high that the component cannot be removed by conventional robotic pick and place machines. A desired level of adhesion is preferably about 20 to 200 grams per linear inch width (gliw), more preferably about 40 to 150 gliw, and most preferably about 100 gliw, although the actual adhesion can depend on the size of the component, smaller components often requiring greater peel adhesion. The desired adhesion values refer to peel adhesion as measured on a conventional adhesion tester such as an Instrumentors, Inc. Slip-Peel Tester Model SP-102C-3M90 adhesion tester using a peel angle of 180° and a rate of 30 cm/min.

Adhesive compositions useful in the invention are non-pressure sensitive adhesive (non-PSA) materials that comprise and, more preferably, consist essentially of a thermoplastic elastomer block copolymer. By a "non-PSA" is meant an adhesive that does not display pressure sensitive properties. A pressure sensitive adhesive is conventionally understood to refer to an adhesive that displays permanent and aggressive tackiness to a wide variety of substrates after applying only light pressure. An accepted quantitative description of a pressure sensitive adhesive is given by the Dahlquist criterion line, which indicates that materials having a storage modulus (G') of less than about $3 \times 10^5$ Pascals (measured at 10 radians/second at room temperature, about 20° to 22° C.) have pressure sensitive adhesive properties while materials having a G' in excess of this value do not. Thus, more specifically, a non-PSA, as used herein, refers to a material that has a storage modulus at least above the Dahlquist criterion line, and more preferably, a storage modulus above $1 \times 10^6$ Pascals.

By a "thermoplastic elastomer block copolymer" is meant a copolymer of segmented A and B blocks or segments and which displays both thermoplastic and elastomeric (i.e., rubbery) behavior. For simplicity, the expressions "thermoplastic elastomer" and "block copolymer" are sometimes used herein to refer to a thermoplastic elastomer block copolymer. Thus, a thermoplastic elastomer may be readily distinguished from natural and synthetic rubbers as well as conventional thermoplastics (e.g., acrylates and vinyls). Thermoplastic elastomers useful in the invention include multi-block copolymers having radial, linear A-B diblock, and linear A-B-A triblock structures, as well as blends of these materials. In these structures A represents a non-rubbery thermoplastic segment (e.g., an end block) and B represents a rubbery elastomeric segment (e.g., a midblock). However, small proportions of other monomers may enter into the block copolymers.

Illustrative thermoplastic A blocks include mono- and polycyclic aromatic hydrocarbons, and more particularly, mono- and polycyclic arenes. Illustrative mono- and polycyclic arenes include substituted and unsubstituted poly (vinyl)arenes of monocyclic and bicyclic structure. Preferred thermoplastic elastomers include thermoplastic segments of substituted or unsubstituted monocyclic arenes of sufficient segment molecular weight to assure phase separation at room temperature. The thermoplastic A blocks may comprise a homopolymer or copolymer of alkenyl arenes.

The alkenyl arenes in the thermoplastic A blocks are preferably monoalkenyl arenes. The term "monoalkenyl arene" will be taken to include particularly those of the benzene series such as styrene and its analogs and homologs including o-methylstyrene, p-methylstyrene, p-tertbutylstyrene, 1,3-dimethylstyrene, alpha-methylstyrene and other ring alkylated styrenes, particularly ring-methylated styrenes, and other mono-alkenyl polycyclic aromatic compounds such as vinyl naphthalene, vinyl anthracene and the like. The preferred monoalkenyl arenes are monovinyl monocyclic arenes such as styrene and alpha-methylstyrene, and styrene is particularly preferred.

The individual thermoplastic A blocks preferably have a number average molecular weight of at least about 6,000 so as to promote good domain formation and, more preferably, a number average molecular weight of about 8,000 to 30,000. The thermoplastic A blocks typically constitute about 5 to 30 percent, and preferably, about 8 to 25 percent by weight of the block copolymer. When the B blocks are comprised of a saturated rubbery elastomer segment, the most preferred thermoplastic elastomers contain A blocks constituting about 15 to 25% by weight of the block copolymer.

The A-B-A designation includes block copolymers that are branched as well as linear and also includes structures in which the end blocks are different from one another but are both derived from styrene or styrene homologs (such structures sometimes being known as A-B-C block copolymers).

The preferred rubbery elastomer B segments are polymer blocks composed of homopolymers of a monomer or copolymers of two or more aliphatic conjugated diene monomers. The conjugated dienes are preferably ones containing from 4 to 8 carbon atoms. Examples of suitable conjugated diene monomers include: 1,3-butadiene (butadiene), 2-methyl-1,3-butadiene (isoprene), 2,3-dimethyl-1,3-butadiene, 1,3-pentadiene (piperylene), 1,3-hexadiene, and the like.

In the most preferred styrenic block copolymers, the rubbery segments may be saturated by hydrogenation of unsaturated precursors such as a styrene-butadiene-styrene block copolymer having center blocks comprising a mixture of 1,4 and 1,2 isomers. Upon hydrogenation of the latter, a styrene-ethylene/butylene-styrene block copolymer is obtained. Similarly, a styrene-isoprene-styrene block copolymer precursor may be hydrogenated to yield a styrene-ethylene/propylene-styrene block copolymer. Rubbery materials such as polyisoprene, polybutadiene and styrene-butadiene rubbers may also be used to form the rubbery elastomer segments. Also particularly preferred are butadiene and isoprene. Mixtures of different conjugated dienes may be used too. The number average molecular weight of the B blocks for the linear diblock and triblock copolymers is preferably in the range of about 4,500 to 180,000.

Radial block copolymers useful in this invention are of the type described in U.S. Pat. No. 3,281,383 and conform to the following general formula: (A-B)nX, wherein A is a thermoplastic block polymerized from styrene or styrene homologs, B is a rubbery elastomeric block derived from conjugated dienes, as indicated above, X is an organic or inorganic connecting molecule with a functionality of 2–4 such as silicon tetrachloride, tin tetrachloride, or divinyl benzene, although others are mentioned in U.S. Pat. No. 3,281,383. X may have a higher functionality in which event "n" is a number corresponding to the functionality of X. The number average molecular weight of the radial block copolymers is preferably in the range of about 125,000 to 400,000.

The thermoplastic elastomer may also comprise a mixture of radial or linear triblock copolymers and simple diblock copolymers. However, the proportion of the diblock copolymers in the mixture of the triblock and diblock copolymers should not exceed about 85 percent by weight and normally lower percentages such as 30% would be used.

A wide variety of commercially available thermoplastic elastomers may be used (either alone or in combination) in the invention including the SOLPRENE family of materials (Phillips Petroleum Co.), the FINAPRENE family of materials (Fina), the TUFPRENE and ASAPRENE families of materials (Asahi), the STEREON family of materials (Firestone Synthetic Rubber & Latex Co.), the EUROPRENE SOL T family of materials (Enichem), the VECTOR family of materials (Dexco Polymers), and the CARIFLEX TR family of materials (Shell Chemical Co.). Also useful is the SEPTON family of materials (Kuraray Co. Ltd.), such as SEPTON 2002, 2005, 2007, 2023, 2043 and 2063. Also useful is the KRATON family of materials (Shell Chemical Co.), such as D-1101, D-1102, D-1107P, D-1111, D-1112, D-1114PX, D-1116, D-1117P, D-1118X, D-1119, D-1122X, D-1124, D-1125PX, D-1184, D-1300X, D-1320X, 4141, 4158, 4433, RP-6408, RP-6409, RP-6614, RP-6906, RP-6912, G-1650, G1651, G-1652, G-1654X, G-1657, G-1701X, G-1702X, G-1726X, G-1750X, G1765X, FG-1901X, FG-1921X, FG-1924, and TKG-101. In general, the KRATON series of hydrogenated thermoplastic elastomers is preferred.

A class of materials which is highly preferred are hydrogenated block copolymers comprising segments of styrene and segments of ethylene/propylene, especially those which have reported coupling efficiency of 100%, have about 15 to 25% (even more preferably about 18 to 23%) styrene, a tensile strength of about 3100 psi, and about a 9% set at break. Such materials may exhibit the following storage modulus profile (at 10 radians/second): about $2.5 \times 10^6$ to $4.0 \times 10^6$ Pascals at 0° C., about $2.7 \times 10^6$ to $4.0 \times 10^6$ Pascals at 20° C., and about $2.9 \times 10^6$ to $3.8 \times 10^6$ Pascals at 40° C. Representative of this class of materials is KRATON RP-6906 and RP-6912, the latter being particularly unique as a linear, multi-block copolymer having four separate blocks (styrene-ethylene/propylene-styrene-ethylene/propylene). Blends of these materials are also useful. This class of materials advantageously provides a useful level of adhesion without adding adhesion modifiers.

Certain of the thermoplastic elastomers useful in the invention may have inherent levels of adhesion that are either too low (especially certain hydrogenated thermoplastic elastomers) or too high (especially certain unhydrogenated thermoplastic elastomers) for maximum utility in carrier tape applications. In addition, certain of the thermoplastic elastomers may insufficiently wet the substrate surface to be bonded, may form a low quality coating, may be difficult to coat, or a combination thereof, for best utility in carrier tape applications. Accordingly, the adhesive compositions may further and optionally comprise an adhesion modifier such as a tackifying resin or a liquid rubber to increase the inherent adhesion, wetting ability or coatability of the thermoplastic elastomer, or a photocrosslinking agent to decrease the inherent adhesion of the thermoplastic elastomer.

Tackifying resins can be added to the thermoplastic elastomer to enhance the initial adhesion strength thereof and to decrease the modulus thereof so as to improve the ability of the adhesive composition to quickly wet the surface of the stored component.

Tackifying resins useful in the invention include resins derived by polymerization of from $C_5$ to $C_9$ unsaturated hydrocarbon monomers, polyterpenes, synthetic polyterpenes, and the like. The tackifying resins may contain ethylene unsaturation; however, saturated tackifying resins are preferred especially for use with hydrogenated thermoplastic elastomers. Hydrocarbon tackifying resins can be prepared by polymerization of monomers consisting primarily of olefins and diolefins and include, for example, residual by-product monomers of the isoprene manufacturing process. These hydrocarbon tackifying resins typically exhibit ball and ring softening points of from about 80° C. to 145° C., acid numbers of from about 0 to 2, and saponification values of less than one. Tackifying resins useful in the invention are typically low molecular weight materials; e.g., a weight average molecular weight of about 350 to 2,500. It is also preferred that the tackifying resins be compatible with the thermoplastic elastomer, by which it is meant that there is no visible evidence of phase separation of these components at room temperature.

Examples of commercially available tackifying resins useful in the invention and which are based on a $C_5$ olefin fraction include Wingtack™ 95 and Wingtack™ 115 (Wingtack Plus) tackifying resins available from Goodyear Tire and Rubber Co. Other hydrocarbon resins include Regalrez™ 1078, Regalrez™ 1094 and Regalrez™ 1126 available from Hercules Chemical Co., Inc.; Arkon resins, such as Arkon™ P115, available from Arakawa Forest Chemical Industries; and Escorez™ resins available from Exxon Chemical Co. Examples of derivatives of rosin, especially hydrogenated derivatives, which are useful in the invention include Foral™ 85 and Foral™ 105 from Hercules Chemical Co., Inc.

Other suitable resins include terpene polymers, such as polymeric resinous materials obtained by polymerization and/or copolymerization of terpene hydrocarbons such as alicyclic, mono, and bicyclic monoterpenes and their mixtures, including carene, isomerized pinene, terpinene, terpentene, and various other terpenes. Commercially available resins of the terpene type include the Zonarez™ terpene B-series and 7000 series available from the Arizona Chemical Corp. Typically properties reported for the Zonarez™ terpene resins include ball and ring softening point of about 80° to 145° C., and saponification numbers of less than one.

The tackifying resin is used in an effective amount, which is an amount intended to give the appropriate level of adhesion to the component carried by the tape while maintaining the non-PSA character of the adhesive. The actual amount of tackifying resin employed will depend on the level on adhesion desired, the composition of the component that is to be bonded, and the modulus of the thermoplastic elastomer. An insufficient amount of tackifying resin may not result in an adequate increase in adhesion. On the other hand, the tackifying resin should not be employed in an amount that will lead to an unacceptably high level of final adhesion as this could make it too difficult to remove the stored component from the carrier tape. In general, the minimum amount of tackifying resin needed to achieve the desired adhesion is employed, which is an amount that is typically less than 10% by weight based on the combined weight of the tackifying resin and the thermoplastic elastomer. More preferably, about 3 to 8% by weight is used.

Alternatively, a liquid rubber may be used to increase the initial adhesion strength of the adhesive composition, decrease its modulus, and improve its ability to wet the component carried by the tape. The liquid rubber should be selected so as to be compatible with the thermoplastic elastomer, by which is meant there is no visible evidence of phase separation at room temperature. The molecular weight of the liquid rubber should be selected so as to inhibit the likelihood of the liquid rubber migrating to the adhesive bond line, which could cause a weak boundary layer and premature release of the stored component. A molecular weight of about 25,000 to 50,000 is useful. While partially hydrogenated liquid rubbers may be used, those which are more fully hydrogenated are preferred, such as hydrogenated liquid isoprene rubber (e.g., Kuraray LIR 290, having a molecular weight of approximately 25,000 from Kuraray Co. Ltd.).

The liquid rubber should be used in an effective amount, which is an amount that is selected by the same criteria discussed above in conjunction with the tackifying resin. Within these parameters, a typical amount of liquid rubber is less than 20% by weight, based on the combined weight of the thermoplastic elastomer and the liquid rubber, more preferably from 5 to less than 20% by weight.

On the other hand, if the final adhesion of the thermoplastic elastomer is too high to permit easy removal of the stored component, then it may be appropriate to add a photocrosslinking agent to decrease the final adhesion of the thermoplastic elastomer. As used herein, a "photocrosslinking agent" refers to an agent which, upon exposure to ultraviolet radiation (e.g., radiation having a wavelength of about 250 to 400 nanometers), causes the thermoplastic elastomer to crosslink.

Photocrosslinking agents suitable for use in the invention include aldehydes, such as benzaldehyde, acetaldehyde, and their substituted derivatives; ketones such as acetophenone, benzophenone and their substituted derivatives such as Sandoray 1000 ™ (Sandoz Chemicals, Inc.); quinones such as the benzoquinones, anthraquinone and their substituted derivatives; thioxanthones such as 2-isopropylthioxanthone and 2-dodecylthioxanthone; and certain chromophore-substituted halomethyl-sym-triazines such as 2,4-bis-(trichloromethyl)-6-(3',4'-dimethoxyphenyl)-sym-triazine, although these latter materials are less preferred because of their potential for generating halogen contaminants.

The photocrosslinking agent is used in a curatively effective amount, by which is meant an amount that is sufficient to cause crosslinking of the adhesive to provide the desired final adhesion properties to the component carried by the tape. An insufficient amount of photocrosslinking agent may cause inadequate curing (i.e., crosslinking) of the adhesive composition such that the adhesion still remains too high, while excess photocrosslinking agent may result in a non-uniform cure through the bulk of the adhesive composition. Within these parameters, the amount of photocrosslinking agent is typically about 0.05 to 2% by weight of the thermoplastic elastomer, more preferably about 0.2 to 1% by weight, and most preferably about 0.3 to 0.5% by weight.

Minor amounts of various additives can also be included in the adhesive compositions. Such additives include pigments, dyes, plasticizers, fillers, stabilizers, ultraviolet absorbers, antioxidants, processing oils, and the like. The amount of additives used can vary depending on the final properties desired.

To provide enhanced utility in the handling of electronic components, the adhesive should be essentially free of ionic impurities that could migrate onto and contaminate the electronic component.

The adhesive composition may be readily prepared. Typically, the thermoplastic elastomer and any tackifying resin or liquid rubber are solublized in a nonpolar organic solvent such as toluene (which may be blended with minor amounts of heptane and/or cyclohexane, or an equal parts by weight blend of methly ethyl ketone and isopropanol) using a roller mill or other low shear mixing device at room temperature for several hours (typically about 2 to 4 hours) until no undissolved thermoplastic elastomer is visible. If a photocrosslinking agent is included it may be added at this time with additional blending on the roller mill to ensure complete dissolution. The resulting solublized thermoplastic elastomer may be diluted to a solids content (e.g., about 25%) that provides a coatable viscosity (e.g., about 4,000 to 5,000 cps) using additional nonpolar organic solvents of the type described above. A 50%/25%/25% by weight blend of toluene/methyl ethyl ketone/isopropanol is particularly preferred as a dilution solvent.

If a photocrosslinking agent has been used, the adhesive can be exposed to ultraviolet radiation having a wavelength of about 250 to 400 nm. The radiant energy in this preferred range of wavelengths required to crosslink the adhesive is about 100 to 1,500 millijoules/cm$^2$, more preferably about 200 to 800 millijoules/cm$^2$.

In another embodiment, the adhesive may be provided in the form of an adhesive tape comprising a permanent backing having a layer of the adhesive thereon. By a "permanent backing" is meant a substrate or backing layer which is intended to form an integral part of the adhesive tape rather than being a removable or releasable component, such as a temporary, protective release liner. Preferably, the permanent backing will contain essentially no water extractable compounds or ionic components so as to reduce the water sensitivity of the permanent backing and to reduce the likelihood of the stored component becoming contaminated by these materials.

Permanent backings useful in the invention may be provided as a single layer film or as a multi-layer film. The thickness of the backing may vary widely so long as the resulting adhesive tape can be readily handled. Within these guidelines it is preferred that the permanent backing have a thickness of about 12 to 50 µm, more preferably a thickness of about 12 to 25 µm, and most preferably a thickness of about 12 to 15 µm.

Materials from which the permanent backings useful in the invention may be made include polyolefins (e.g., polyethylene, polypropylene, polybutene and polymethylpentene), ethylene/vinyl monomer copolymers (e.g., ethylene/(meth) acrylic acid copolymer and ethylene/vinyl acetate copolymer), polybutadiene, poly (vinylchloride), polyurethane, polyamide, and polyester (especially polyethylene terephthalate).

Adhesive tapes useful in the invention can be easily prepared. In this instance, the solvated adhesive solution described previously may be applied to the permanent backing by a variety of coating methods including knife coating, slotted knife coating or reverse roll coating and then drying at a temperature (e.g., about 65° to 120° C.) and a time (e.g., several minutes to about one hour) so as to provide the adhesive tape.

Figure 5:
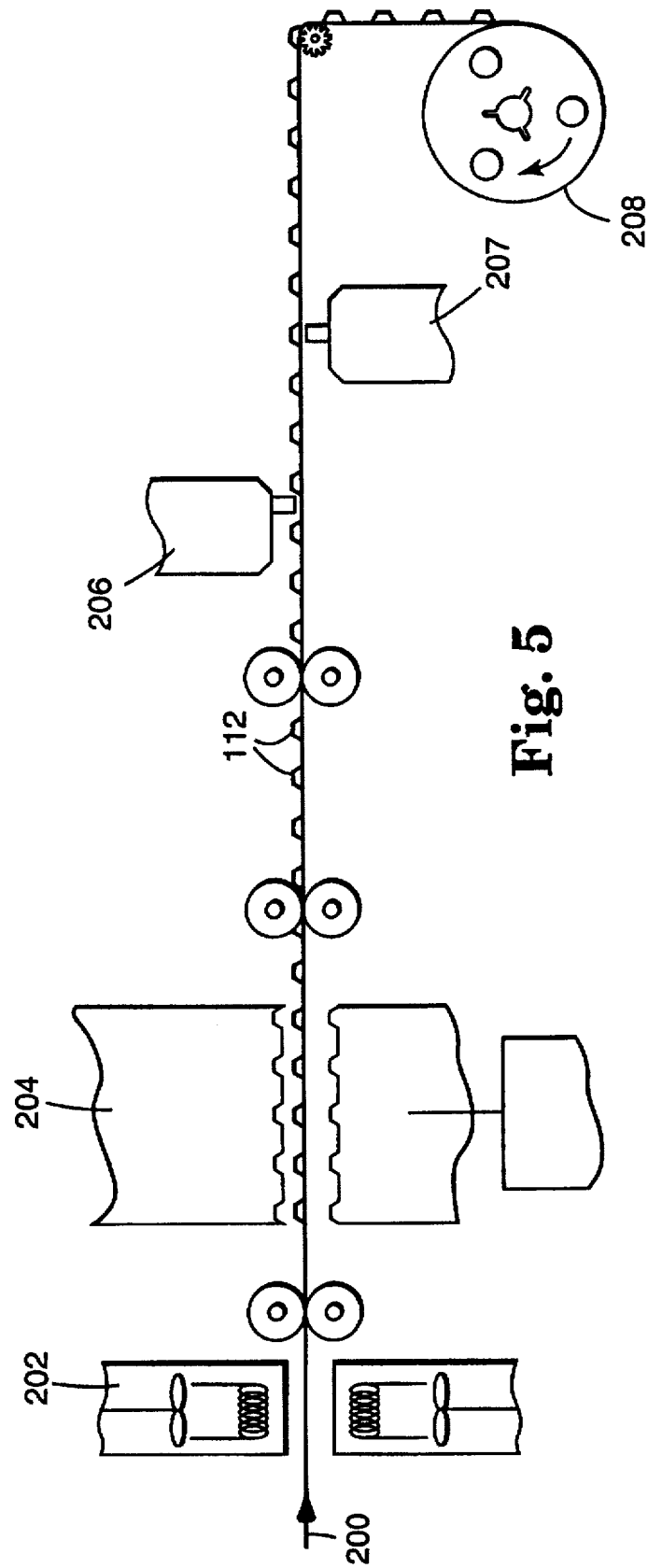
FIG. 5 is a schematic illustration of one method for manufacturing a carrier tape according to the invention.

In general, the carrier tapes of the present invention are made by shaping the pockets in a sheet of polymeric material and winding the carrier tape onto a reel to form a roll. More specifically, and with reference to the schematic view of FIG. 5 as an example, a web 200 of a flexible thermoplastic polymer is supplied as a preformed roll, as a preformed sheet, by direct extrusion (e.g., a hopper-fed, single screw, three zone extruder fitted with a sheet forming die), or by continuous injection molding to a mold or die 204 (which may be a pair of matched male and female dies) that thermoform the web. Mold 204 thermoforms the pockets to the desired size and shape (allowing for any subsequent shrinkage upon cooling). The dimensions of the incoming polymeric web will be determined by the gauge and width of the carrier tape that is to be formed.

By "thermoforms" and "thermoforming" is meant a process that relies on the use of both heat and pressure to deform a thermoplastic material. The heat may be provided by the mold itself, a preheater 202, or an extruder (not shown specifically). In any event, polymeric web 200 is heated sufficiently to permit thermoforming. The temperature to which the polymeric web must be heated varies over a broad range (i.e., about 200°–370° F.) depending on the gauge and type of material that is being thermoformed as well as the speed of the manufacturing line. The applied pressure is sufficient to permit a high quality replication of the mold or die pattern and may be provided by, for example, the force the mold exerts upon web 200 when the mold closes or by the application of a vacuum that urges the web to deform over a male die or draws the web into a female die (i.e., vacuum thermoforming). A rotary vacuum thermoforming mold is particularly useful. Web 200 is typically cooled after thermoforming, which can be accomplished by air cooling, fans, a water bath or a cooling oven until the thermoplastic polymer solidifies.

In general, thermoforming is a process that is familiar to those of ordinary skill in the art and is described in various references such as *Encyclopedia of Polmer Science and Engineering*, volume 16, second edition, published by John Wiley & Sons, 1989, which discusses different thermoforming processes and the use of roll-fed, sheet-fed, in-line extrusion, and continuous web-fed systems. All of these can be employed to manufacture the carrier tapes of the invention, as can different thermoforming tools that are described in the technical literature, such as flat forming and rotary devices, these devices being available for use with various thermoforming techniques such as matched mold forming, plug-assist forming, basic vacuum forming, and pressure forming.

The advancement holes are subsequently formed in a separate operation such as punching by punch 206.

Once the carrier tape has been prepared, the adhesive may be applied to the bottom wall of the pockets by a variety of techniques (schematically illustrated in the drawings as station 207) including direct coating onto the bottom wall, ink jet printing, and the like. If the adhesive is provided in the form of an adhesive tape such as those described above, the tape may affixed to the bottom wall of the pocket with a layer of adhesive (such as a high tack acrylic adhesive) or with an adhesive transfer tape (such as #927 High Tack Adhesive Transfer Tape from 3M Company or #9415 Double Coated Tape from 3M Company).

It is also possible to provide the adhesive as a pre-formed film that can be applied to the bottom wall of the pocket using equipment conventionally employed in the labeling industry to apply a label to the bottom of a shallow, recessed pocket. In this instance, the solvated adhesive solution described previously may be applied to a temporary support rather than a permanent backing but still using the techniques described above for preparing an adhesive tape. The temporary support may be a release liner such as a polyolefin (e.g., polyethylene or polypropylene) or polyester (e.g., polyethylene terephthalate) film, or a paper or plastic film that has been treated with a release material such as silicones, waxes, fluorocarbons, and the like. The adhesive-coated temporary support would then be processed by the label handling equipment, transferring the adhesive film to the bottom wall of the pocket.

Figure 6:
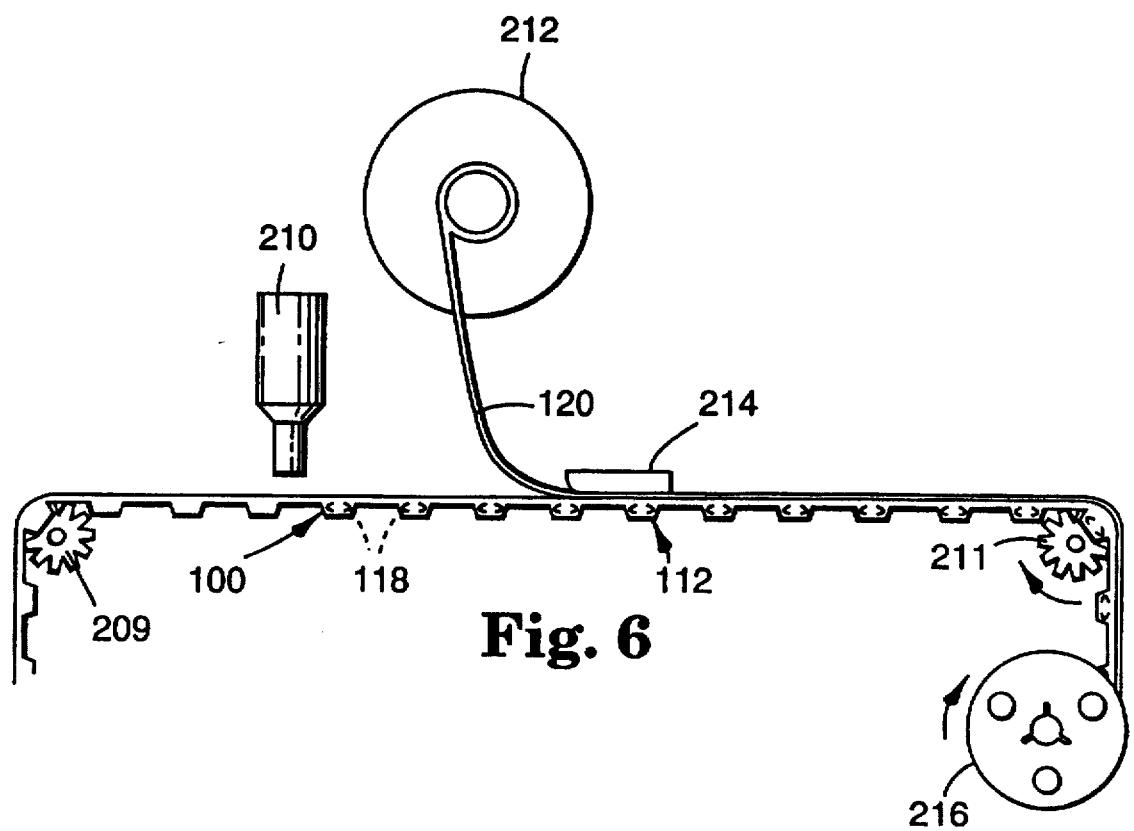
FIG. 6 is a schematic view illustrating how a carrier tape according to the invention may be loaded with components followed by the application of an optional cover.

The carrier tape is then wound (either concentric or level windings) about the core of reel 208 to form a supply roll for storage until the carrier tape is loaded with components. Alternatively, and as shown in FIG. 6, immediately after carrier tape 100, is formed, a component loader 210 may fill pockets 112 with components 118, cover 120 (if included) is delivered from a roll 212 and secured by an applicator 214 (which is heated in the case of a cover that provides a heat-activated bond) to the longitudinal edge surfaces of the carrier tape strip portion, and the loaded carrier tape is wound about a core or reel 216 for storage or delivery. Carrier tape 100 is advanced by sprockets 209 and 211.

Figure 7:
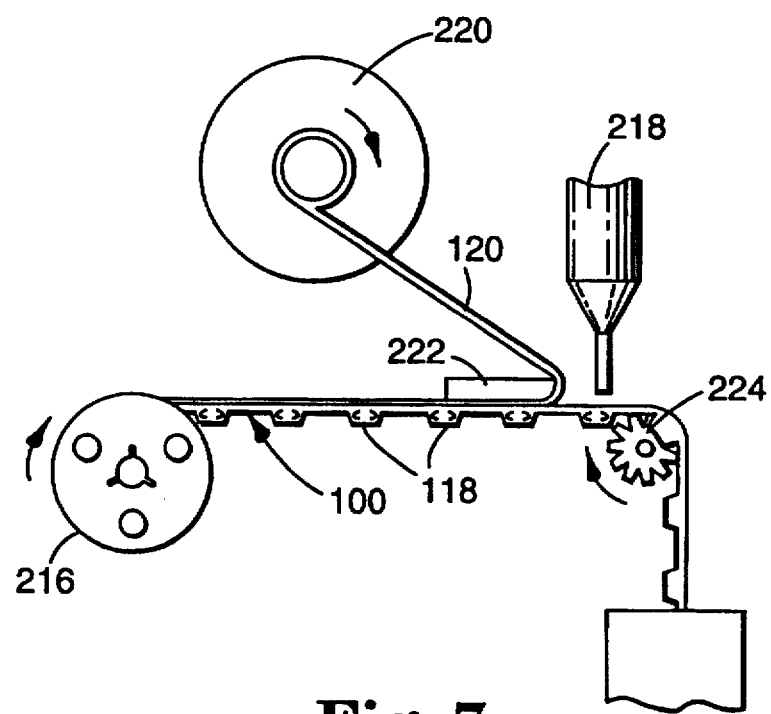
FIG. 7 is a schematic view illustrating a robotic machine removing components from a carrier tape according to the invention.

In use, the carrier tape is unloaded as shown in the schematic example of FIG. 7, which illustrates a carrier tape 100 in combination with a robotic placement machine 218. Supply reel 216 provides carrier tape 100. A stripper assembly 220 peels cover 120 (if included) from carrier tape 100 around a stripper block 222, which assists in preventing the stripper assembly from pulling the carrier tape away from its designated path. Carrier tape 100 is advanced by a sprocket 224, to move the carrier tape toward robotic placement machine 218. As each successive component reaches the desired pick-up point, the robotic placement machine grasps the component (either manually or by suction) and places it, for example, on a circuit board in the appropriate location. Preferably, adhesive 119 does not transfer to component 118 upon removal from the carrier tape, by which it is meant that to the unaided human eye there is no visible adhesive residue on the component.

The carrier tapes of the invention are particularly useful in the electronics industry for transporting and delivering surface mount electronic components such as memory chips, integrated circuit chips, resistors, connectors, dual in-line processors, capacitors, gate arrays, etc. However, the carrier tapes may be used to transport other components such as small springs, clips, and the like.

The present invention has now been described with reference to several embodiments thereof. It will be apparent to those skilled in the art that many changes can be made in the embodiments described without departing from the scope of the invention. Hence, the scope of the present invention shall not be limited by the structures described herein, but only by structures described by the language of the claims and the equivalents of those structures.

The embodiments for which an exclusive property or privilege is claimed are defined as follows:

1. A method of retaining a component in a pocket of a carrier tape for storage and delivery of components by an advancement mechanism, the method comprising:
    (a) providing a carrier tape having a pocket which includes a bottom wall;
    (b) applying an adhesive to the bottom wall of the pocket for retaining the component in the pocket, wherein the adhesive is a non-pressure sensitive adhesive that comprises a thermoplastic elastomer block copolymer and further wherein the adhesive has a storage modulus at room temperature that is greater than $3 \times 10^5$ Pascals; and
    (c) bonding the component to the adhesive.

2. A method according to claim 1 wherein the carrier tape comprises:
    (1) a strip portion having a top surface, and a bottom surface opposite the top surface; and
    (2) a plurality of aligned pockets for carrying the components, the pockets being spaced along the strip portion and opening through the top surface thereof, wherein each pocket comprises:
        (i) at least one side wall adjoining and extending downwardly from the strip portion; and
        (ii) a bottom wall adjoining the at least one side wall to form the pocket.

3. A method according to claim 2 wherein each pocket comprises:
   (i) four side walls each at generally right angles with respect to each adjacent side wall, the side walls adjoining and extending downwardly from the strip portion; and
   (ii) a bottom wall adjoining the side walls to form the pocket.

4. A method according to claim 2 wherein the bottom wall of each pocket includes an aperture formed through the bottom wall.

5. A method according to claim 2 wherein the strip portion has first and second parallel longitudinal edge surfaces and at least one of the edge surfaces includes a plurality of equally spaced holes for receiving the advancement mechanism.

6. A method according to claim 2 wherein the adhesive has a storage modulus greater than $1 \times 10^6$ Pascals.

7. A method according to claim 2 wherein the thermoplastic elastomer block copolymer comprises repeating blocks of styrene and repeating blocks of a rubbery elastomer.

8. A method according to claim 2 wherein the thermoplastic elastomer block copolymer is selected from the group consisting of styrene-ethylene/propylene-styrene block copolymer, styrene-ethylene/propylene-styrene-ethylene/propylene block copolymer, styrene-ethylene/butylene-styrene block copolymer, and blends thereof.

9. A method according to claim 2 wherein the adhesive further comprises a tackifying resin.

10. A method according to claim 9 wherein the tackifying resin is present in an amount of less than 10% by weight, based on the combined weight of the thermoplastic elastomer block copolymer and tackifying resin.

11. A method according to claim 2 wherein the adhesive further comprises a liquid rubber.

12. A method according to claim 11 wherein the liquid rubber is present in an amount of less than 20% by weight based on the combined weight of the thermoplastic elastomer block copolymer and the liquid rubber.

13. A method according to claim 2 wherein the adhesive further comprises a photocrosslinking agent.

14. A method according to claim 1 further comprising a step of releasably securing a cover to the carrier tape for covering the pocket.

15. A method according to claim 1 further comprising a step of winding the carrier tape about the core of a reel.

16. A method according to claim 1 wherein the adhesive exhibits a peel adhesion of about 20 to 200 grams per linear inch width to the component.

17. A method according to claim 16 wherein the adhesive exhibits a peel adhesion of about 50 to 140 grams per linear inch width to the component.

18. A method according to claim 17 wherein the adhesive exhibits a peel adhesion of about 20 to 200 grams per linear inch width after dwelling in contact with the component for a period of at least 7 days under ambient conditions.

19. A method according to claim 1 wherein the non-pressure sensitive adhesive is applied in the form of an adhesive tape comprising a permanent backing with a layer of the non-pressure sensitive adhesive on the permanent backing, the permanent backing being disposed between the bottom wall of the pocket and the layer of the non-pressure sensitive adhesive.

20. A method according to claim 19 wherein the adhesive tape is affixed to the bottom wall of the pocket by a layer of an adhesive or by a second adhesive tape.

21. A method according to claim 1 wherein the adhesive is applied to the bottom wall of the pocket by coating.

22. A method according to claim 1 wherein the adhesive is applied to the bottom wall of the pocket by printing.

* * * * *